United States Patent [19]

Tam et al.

[11] Patent Number: 5,895,247

[45] Date of Patent: Apr. 20, 1999

[54] METHOD OF FORMING A HIGH PERFORMANCE, HIGH VOLTAGE NON-EPI BIPOLAR TRANSISTOR

[75] Inventors: Gordon Tam, Gilbert; Pak Tam, Tempe, both of Ariz.

[73] Assignee: Motorola Inc., Schaumburg, Ill.

[21] Appl. No.: 08/905,008

[22] Filed: Aug. 11, 1997

Related U.S. Application Data

[62] Division of application No. 08/835,548, Apr. 8, 1997, Pat. No. 5,760,459, which is a continuation of application No. 08/361,403, Dec. 22, 1994, abandoned.

[51] Int. Cl.⁶ .................................................. H01L 21/331
[52] U.S. Cl. ........................ 438/309; 438/234; 438/335; 438/365
[58] Field of Search ........................ 438/234, 309, 438/335, 356, 364, 365

[56] References Cited

U.S. PATENT DOCUMENTS 4,435,225  3/1984  Shideler et al. .................... 438/339
4,839,302  6/1989  Kameyama et al. ................. 438/350
4,866,001  9/1989  Pickett et al. ..................... 148/DIG. 10

*Primary Examiner*—Tuan H. Nguyen
*Attorney, Agent, or Firm*—George C. Chen

[57] ABSTRACT

A high performance, high voltage non-epi bipolar transistor including a substrate (12) with an n-type conductivity well (13) and an insulative layer (14) with first (15), second (17) and third (18) openings exposing the substrate in the well. A first p-type volume (19) surrounding the first and second openings (15, 17) beneath the insulative layer (14), and a second n-type volume (22) surrounding the third opening (18) beneath the insulative layer (14). A p-type intrinsic base (25) in the first opening (15) and in contact with the first volume (19). A p-type extrinsic base (30) in the second opening (17) and in contact with the first volume (19). An n-type collector (32) in the third opening (18) and in contact with the second volume (22), and an n-type emitter layer (27) in the first opening in overlying contact with the intrinsic base (25).

20 Claims, 3 Drawing Sheets

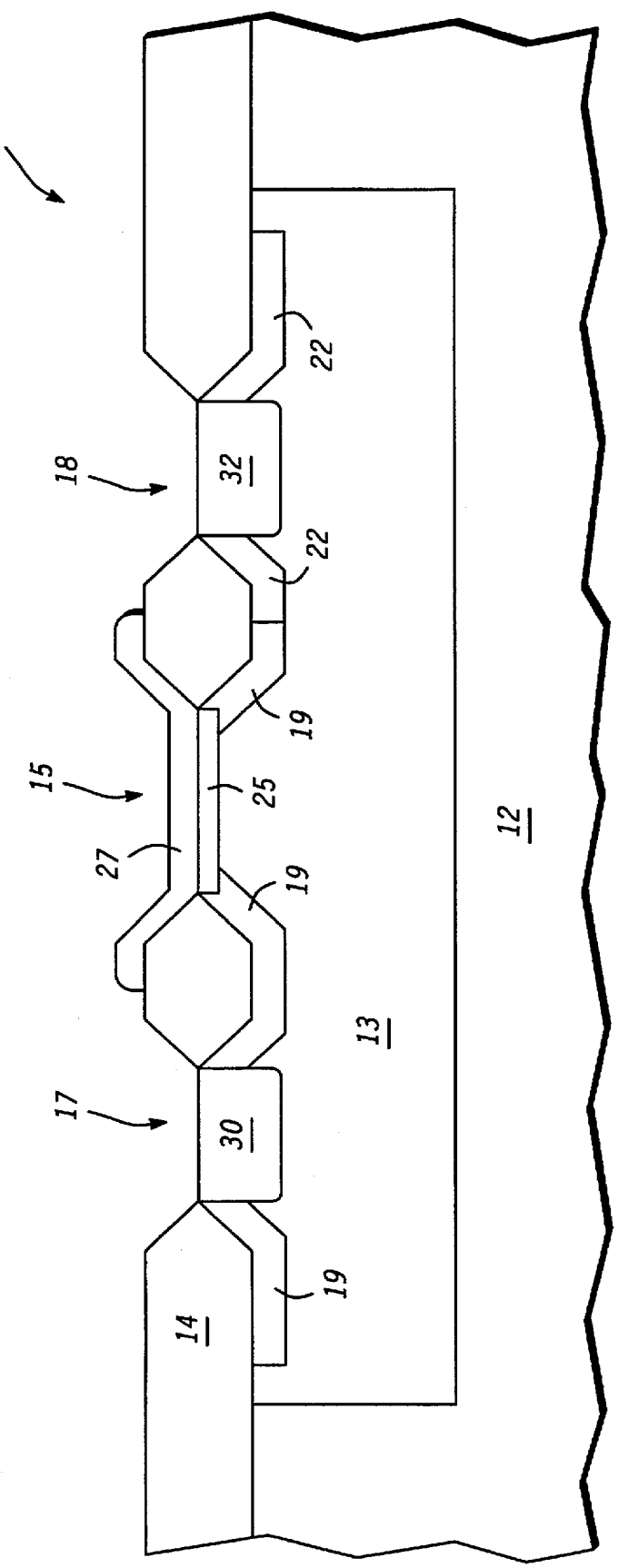

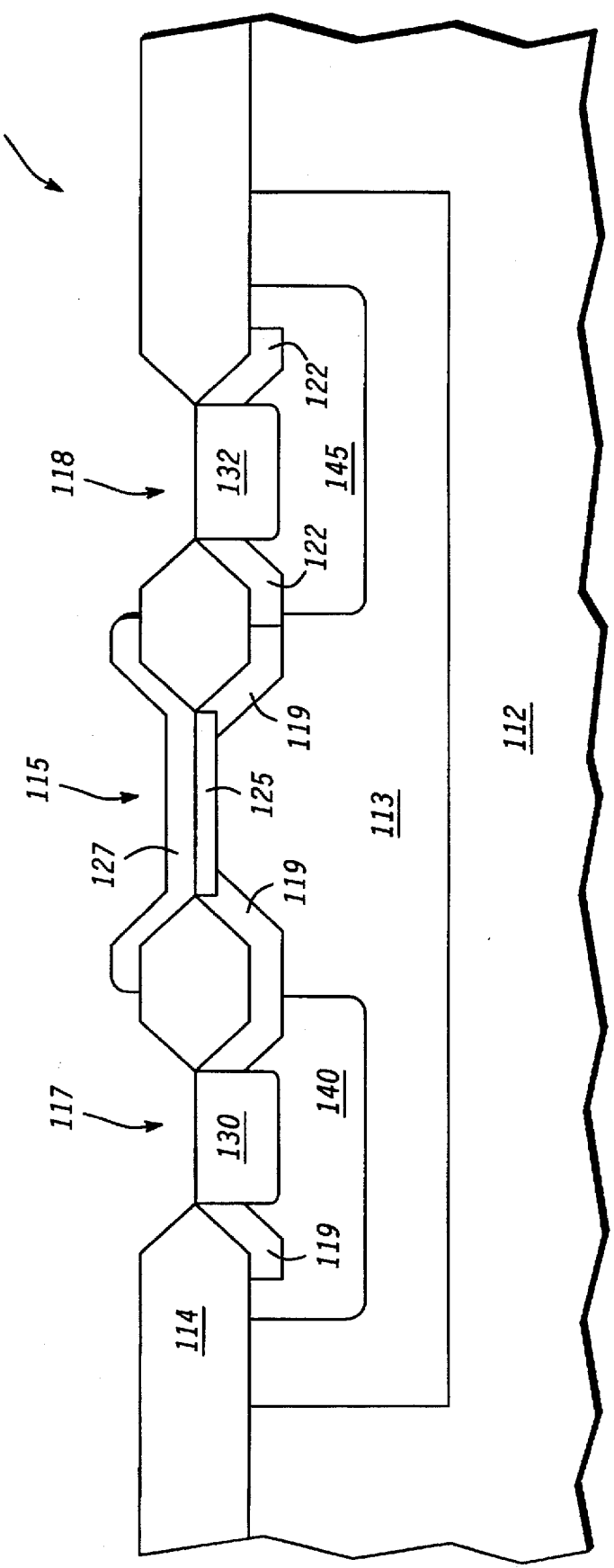

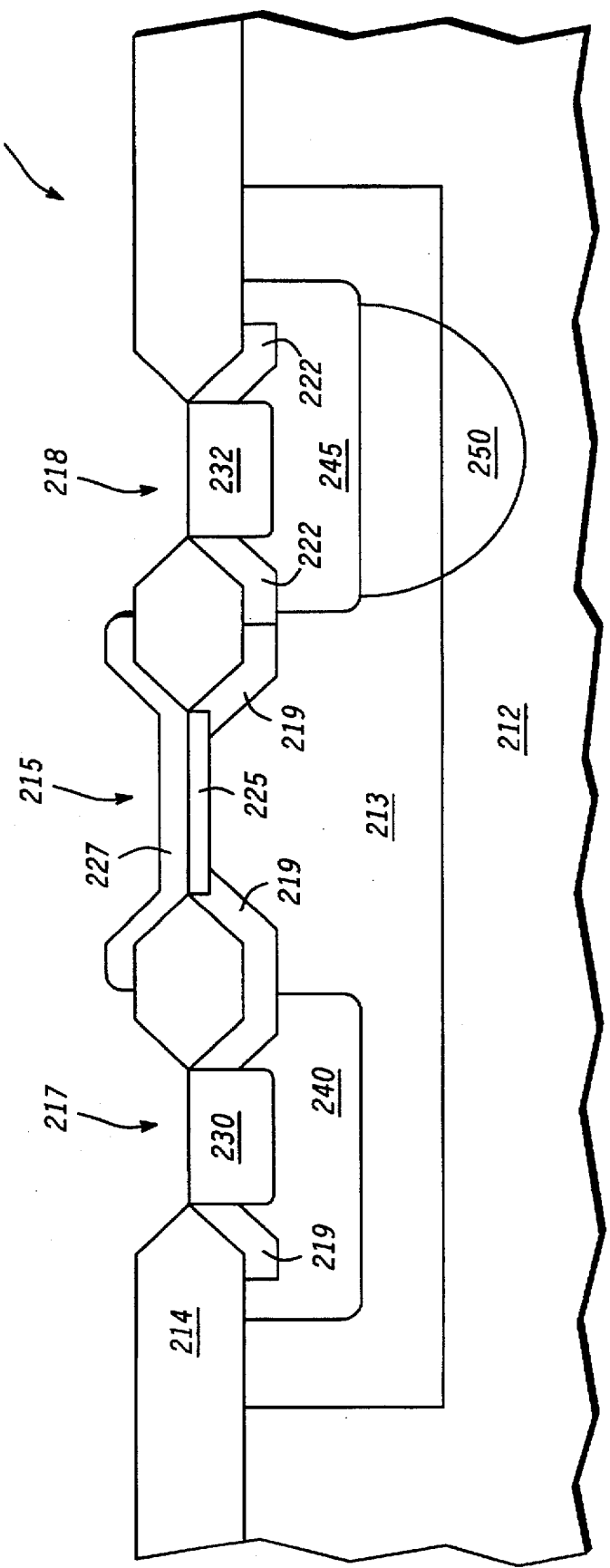

METHOD OF FORMING A HIGH PERFORMANCE, HIGH VOLTAGE NON-EPI BIPOLAR TRANSISTOR

This is a division of application Ser. No. 08/835,548, filed Apr. 8, 1997, now U.S. Pat. No. 5,760,459 which is a continuation of application Ser. No. 08/361,403, filed Dec. 22, 1994, now abandoned.

FIELD OF THE INVENTION

The present invention pertains to bipolar devices and more specifically high performance, high voltage bipolar transistor.

BACKGROUND OF THE INVENTION

Generally, in a common prior art fabrication method, bipolar transistors are fabricated in a relatively simple diffusion method that can be adapted to other manufacturing processes, such as the well known CMOS process. In a typical example, a substrate doped for p-type conduction is provided. A well of n-type conduction is formed in the substrate by ion implantation and drive-in or diffusing an impurity into the substrate. An insulating layer is formed on the surface of the substrate, generally during, or as a step in, the CMOS manufacturing process, and three spaced apart openings are formed in overlying relationship to the n-type well to define an emitter, base and collector. A smaller well of p-type conduction is then formed in the n-type well so as to be spaced from the sides and bottom of the n-type well and so that the emitter and base openings overlie the p-type well and the collector opening overlies the n-type well. An emitter is then diffused or implanted in the emitter opening and base and collector contacts are diffused or implanted in the base and collector openings, respectively.

The major problem with this prior art bipolar transistor is the fact that the depth of the p-type well between the emitter and the n-type well is the thickness of the base and this thickness determines the speed or frequency response of the bipolar transistor. Because of the spreading of the diffusion, or implant and anneal, it is difficult to control the base thickness and impossible to make it thin enough to arrive at a very high frequency device. Generally, these prior art bipolar transistors are limited in frequency response to below 500 MHz, and usually operate at 300 MHz or below. However, these prior art bipolar transistors did have a relatively good collector-to-emitter breakdown voltage ($BV_{CEO}$).

The problem of a low frequency response was solved in another prior art bipolar transistor utilizing sub-collector epitaxially grown layers (epi layers) on the surface of the substrate along with narrow base width. In this prior art bipolar transistor, a heavily doped sub-collector is formed in the surface of the substrate and an epi layer is grown over the top so that the heavily doped layer becomes a buried conductive layer. An insulating layer is formed on the surface of the epi layer and three spaced apart openings are formed in the insulating layer to define an emitter, base and collector. A very thin intrinsic base is formed in the emitter opening. An extrinsic base is formed in the base opening and connected to the intrinsic base through the epi layer in some fashion, generally with a diffusion or implant. An emitter is formed in overlying relationship to the intrinsic base. Also, a deep diffusion or implant is formed in the collector opening which is deep enough to be in contact with the buried layer and a collector contact is formed in the collector opening in contact with the deep diffusion.

This epi layer bipolar transistor can be fabricated with a very high frequency response, in a range of 300 MHz to 10 GHz. The epi layer is generally grown very thin so that the spacing between the intrinsic and extrinsic bases and the buried layer is relatively small. However, the $BV_{CEO}$ of the transistor is reduced. Generally, the $BV_{CEO}$ of high performance epi layer bipolar transistors is below 9 volts and for very high frequency bipolar transistors may be below 5 volts.

Another major problem with epi layer bipolar transistors is the fact that the fabrication process is very long, complicated and expensive. Also, the epi layer bipolar fabrication process is incompatible with standard CMOS process. Therefore, the epi layer bipolar transistors add substantially to the cost of manufacturing, if there is an attempt to integrate them into other fabrication processes (if integration is even possible).

Thus, it would be desirable to provide an improved bipolar transistor which incorporates a high frequency response with a relatively high $BV_{CEO}$ and fabrication techniques compatible with standard CMOS, HVCMOS and SMART POWER fabrication processes.

It is a purpose of the present invention to provide a new and improved high performance, high voltage non-epi bipolar transistor.

It is another purpose of the present invention to provide a new and improved high performance, high voltage non-epi bipolar transistor which is fabricated by methods which are CMOS and HVCMOS compatible.

It is yet another purpose of the present invention to provide a new and improved high performance, high voltage non-epi bipolar transistor which is incorporated into CMOS and/or HVCMOS fabrication.

It is still another purpose of the present invention to provide a new and improved method of fabricating a high performance, high voltage non-epi bipolar transistor at a relatively low cost.

It is a further purpose of the present invention to provide a new and improved high performance, high voltage non-epi bipolar transistor having a relatively high speed and high cutoff frequency.

It is yet a further purpose of the present invention to provide a new and improved high performance, high voltage non-epi bipolar transistor with a high $BV_{CEO}$ relative to the speed/ cutoff frequency of the bipolar transistor.

It is still another purpose of the present invention to provide a new and improved high performance, high voltage non-epi bipolar transistor with an inherently high yield.

SUMMARY OF THE INVENTION

The above problems and others are at least partially solved and the above purposes and others are realized in a bipolar transistor including a substrate having a surface and a well of a first conductivity type formed in the substrate adjacent the surface. An insulative layer is positioned on the surface of the substrate in overlying relationship to the well with first, second and third contact openings defined therethrough in spaced apart relationship and exposing the surface of the substrate in the well. A first volume of a second conductivity type is positioned in the substrate surrounding the first contact opening beneath the insulative layer, a second volume of the second conductivity type is positioned in the substrate surrounding the second contact opening beneath the insulative layer and in contact with the first volume, and a third volume of the first conductivity type is positioned in the substrate surrounding the third contact opening beneath the insulative layer. An intrinsic base of the second conductivity type is positioned in the substrate in the first contact opening and in contact with the first volume, an extrinsic base of the second conductivity type positioned in the substrate in the second contact opening and in contact with the second volume, and a collector of the first conductivity type is positioned in the third contact opening and in contact with the third volume. An emitter layer doped with the first conductivity type is positioned in the first contact opening in overlying contact with the intrinsic base.

The above problems and others are at least partially solved and the above purposes and others are further realized in a method of fabricating a bipolar transistor including fabricating the bipolar transistor described above by performing the method in a CMOS process utilizing CMOS masks and process steps with only an additional mask required for the step of forming an intrinsic base. Also, in a specific method of fabricating a bipolar transistor in a CMOS process utilizing CMOS masks and process steps, a step of forming an emitter layer includes defining a polysilicon emitter on the intrinsic base using a CMOS polysilicon gate mask.

BRIEF DESCRIPTION OF THE DRAWINGS

Referring to the drawings:

FIG. 1 is a simplified sectional view of a high performance, high voltage non-epi bipolar transistor in accordance with the present invention;

FIG. 2 is a simplified sectional view of another embodiment of a high performance, high voltage non-epi bipolar transistor in accordance with the present invention; and FIG. 3 is a simplified sectional view of another embodiment of a high performance, high voltage non-epi bipolar transistor in accordance with the present invention.

DESCRIPTION OF THE PREFERRED EMBODIMENT

Referring specifically to FIG. 1 a simplified sectional view of a high performance, high voltage non-epi bipolar transistor 10, fabricated in accordance with the present invention, is illustrated. Bipolar transistor 10 includes a substrate 12 having a surface and a well 13 of a first conductivity type formed in substrate 12 adjacent the surface. In this embodiment for purposes of explanation only, the first conductivity type is n-type conductivity formed by the introduction of an n-type doping material or impurity into the substrate which produces this type of conductivity. An insulative layer 14 is positioned on the surface of substrate 12 in overlying relationship to well 13. An emitter opening 15, a base opening 17, and a collector opening 18 are defined through insulative layer 14 in spaced apart relationship and exposing the surface of substrate 12 in well 13. Generally, insulative layer 14 is, or may be, formed during a CMOS process utilizing CMOS masks and process steps.

A volume 19 of a second conductivity type, in this embodiment p-type conductivity, is positioned in substrate 12 surrounding emitter opening 15 and base opening 17 beneath insulative layer 14. A volume 22 of the first conductivity type (n-type) is positioned in substrate 12 surrounding collector opening 18 beneath insulative layer 14. As will be explained presently, volumes 19 and 22 are included in substrate 12 for purposes of internal connection and for reducing resistances.

An intrinsic base 25 of the second conductivity type (p-type) is positioned in substrate 12 in emitter opening 15 and in contact with volume 19. Here it should be understood that the method used during the fabrication of the above described elements is completely compatible with, for example, CMOS fabrication steps and may either be formed during CMOS fabrication steps or as a slightly different addition to the process. The entire process described herein can be incorporated into the CMOS (or HVCMOS) process, requiring only one additional mask, that additional mask being for the step of forming intrinsic base 25.

An emitter layer 27 is formed in emitter opening 15 in overlying contact with intrinsic base 25. Emitter layer 27 is doped with the first conductivity type (n-type) in any conventional fashion, such as implanting, diffusion, etc. As will be understood presently, intrinsic base 25 can be formed sufficiently shallow to increase the speed of bipolar transistor 10 without substantially reducing the breakdown voltage. This feature is at least partially due to the fact that volumes 19 and 22 provide the internal connection of the base and collector, respectively, to reduce internal resistances and maintain high $BV_{CEO}$.

An extrinsic base 30 (or a base contact) of the second conductivity type (p-type) is positioned in substrate 12 in base opening 17 and in contact with volume 19. Volume 19 forms an internal, low resistance connection between intrinsic base 25 and extrinsic base 30. A collector contact 32 of the first conductivity type (n-type) is positioned in collector opening 18. Collector contact 32 is in contact with volume 22 to spread the effective contact surface with well 13 over a greater area and, thereby, reducing the distance to intrinsic base 25 and, thus, the collector resistance. If the fabrication of bipolar transistor 10 is incorporated into a CMOS process, the base and collector resistances can be further reduced by optimizing the CMOS process.

A method of fabricating high performance, high voltage non-epi bipolar transistor 10 includes the following steps. It will of course be understood that the order of the steps described below is for purpose of this explanation and may be modified and/or integrated if desired or convenient. Substrate 12 is provided and, in this specific example is doped with a p-type conductivity. As mentioned above, substrate 12 may be a substrate on which a CMOS, HVCMOS, or SMARTPOWER circuit is being fabricated by the CMOS process. Generally, substrate 12 is silicon material, but it will be understood that it could be any semiconductor material, such as silicon carbide, gallium arsenide, etc. Well 13 is formed in substrate 12 by some convenient process, for example diffusion or implant and anneal of a dopant material of first conductivity type (n-type) in substrate 12 adjacent the surface.

The next step performed is the formation of volume 19 of the second conductivity type (p-type) in substrate 12 surrounding emitter opening 15 and base opening 17 beneath insulative layer 14. In this specific example, volume 19 is formed by field implanting boron ions with a dose in the range of 1E13 cm$^{-2}$ to 1E14 cm$^{-2}$ at 15–60 KeV. Generally, it should be noted that base current increases, or base resistance decreases, with increasing field implant doses for volume 19. Furthermore, the step of forming volume 22 of the first conductivity type (n-type) in substrate 12 surrounding collector opening 18 beneath insulative layer 14 is performed, either before or after the formation of volume 19. In this specific example, volume 22 is formed by field implanting phosphorus ions with a dose in the range of 1E13 cm$^{-2}$ to 1E14 cm$^{-2}$ at 25–100 KeV. Generally, it should be noted that collector resistance decreases with increasing field implant doses for volume 22.

Next, an insulative layer 14 is formed on the surface of substrate 12 by some convenient method. If bipolar transistor 10 is incorporated into a CMOS process for example, insulative layer 14 is a field oxide grown on the surface of substrate 12. Emitter opening 15, base opening 17 and collector opening 18 are formed in insulative layer 14 either by masking substrate 12 and growing insulative layer 14, as utilized in this specific example, or by growing insulative layer 14 as a blanket and then masking and etching it to define openings 15, 17 and 18.

The next step is the formation of intrinsic base 25 of the second conductivity type (p-type) in emitter opening 15, in contact with volume 19. Intrinsic base 25 can be implanted, diffused, etc. into substrate 12. In this specific example, intrinsic base 25 is formed by implanting boron ions with a dose in the range of $5E12$ cm$^{-2}$ to $8E13$ cm$^{-2}$ at 15–60 KeV. It should be understood that the beta of bipolar transistor 10 decreases as the intrinsic base implant dosage increases and that the collector current decreases with increasing intrinsic base implant dosage.

The next step is the formation of emitter layer 27 in emitter opening 15 in overlying contact with intrinsic base 25. In this specific embodiment, emitter layer 27 is a polysilicon material grown on the surface of silicon substrate 12 in overlying contact with intrinsic base 25. If bipolar transistor 10 is incorporated into a CMOS process for example, a CMOS mask is used to define emitter polysilicon layer 27. Emitter layer 27 is doped with the first conductivity type (n$^+$-type) by any convenient method, such as implanting, diffusion, etc. In this specific example, emitter layer 27 is doped by implanting arsenic ions with a dose in the range of $1E15$ cm$^{-2}$ to $5E16$ cm$^{-2}$ at 15–80 KeV. Generally, the size of emitter opening 15 determines the area size of intrinsic base 25 and the contacting portion of emitter layer 27. In this specific example the emitter size is approximately 1 to 2 microns square.

The next step is the formation of extrinsic base 30 of the second conductivity type (p$^+$-type) in base opening 17 in contact with volume 19. In this specific example, extrinsic base 30 is formed by implanting boron ions with a dose in the range of $1E14$ cm$^{-2}$ to $5E16$ cm$^{-2}$ at 15–60 KeV. Either before or after the formation of extrinsic base 30, collector 32 of the first conductivity type (n$^+$-type) is formed in collector opening 18 in contact with volume 22. In this specific example, collector 32 is formed by implanting arsenic ions with a dose in the range of $1E15$ cm$^{-2}$ to $5E16$ cm$^{-2}$ at 15–80 KeV.

Referring specifically to FIG. 2, a simplified sectional view of another embodiment of a high performance, high voltage non-epi bipolar transistor 110, constructed in accordance with the present invention, is illustrated. Generally, bipolar transistor 110 is similar to bipolar transistor 10 of FIG. 1 and can be constructed using substantially the same fabrication techniques. Also, similar components are designated with similar numerals having a "1" prefix added to designate the different embodiment. In this embodiment, a p-type implant 140 is formed below and in contact with extrinsic base 130. Generally, a p-type implant increases the volume of the extrinsic base while reducing the base resistance. In this specific example, a p-type implant 140 is formed by implanting boron ions with a dose in the range of $5E12$ cm$^{-2}$ to $5E15$ cm$^{-2}$ at 15–60 KeV. Also, in this embodiment, an n-type implant 145 is formed below and in contact with collector 132. An n-type implant 145 is incorporated to reduce the collector resistance. In this specific example, an n-type implant 145 is formed by implanting phosphorus ions with a dose in the range of $5E12$ cm$^{-2}$ to $1E16$ cm$^{-2}$ at 25–80 KeV. These p-type and n-type implants are formed, at any convenient time and, in this specific embodiment preferably prior to the step of forming emitter layer 127.

Referring specifically to FIG. 3, a simplified sectional view of another embodiment of a high performance, high voltage non-epi bipolar transistor 210, constructed in accordance with the present invention, is illustrated. Generally, bipolar transistor 210 is similar to bipolar transistor 10 of FIG. 1 and can be constructed using substantially the same fabrication techniques. Also, similar components are designated with similar numerals having a "2" prefix added to designate the different embodiment. In this embodiment, a deep implant isolation volume 250 of the first conductivity type (n$^+$-type) is provided and positioned below n-type implant 245 and collector 232, at least partially in well 213 and extending into substrate 212 below well 213. Deep implant or diffusion volume 250 is included to further enhance performance by reducing the collector resistance. In this specific example, deep implant volume 250 is formed by implanting phosphorous ions with a dose in the range of $1E15$ cm$^{-2}$ to $5E16$ cm$^{-2}$ at 25–80 KeV. Deep implant volume 250 is formed, at any convenient time and, in this specific embodiment preferably prior to the step of forming well 213.

Thus, high performance, high voltage non-epi bipolar transistors are disclosed and methods of fabricating which have an inherently high yield and low cost due to their unique CMOS and HVCMOS compatibility. Further, the disclosed high performance, high voltage non-epi bipolar transistors have a high speed and consequent high cutoff frequency and a high $BV_{CEO}$ relative to that speed or cutoff frequency. Several embodiments have been illustrated and described which effect or enhance the performance of the high performance, high voltage non-epi bipolar transistors.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

I claim:

1. A method of fabricating a non-epi bipolar transistor comprising the steps of:

providing a substrate having a surface;

forming a well of a first conductivity type in the substrate adjacent to the surface;

forming a first doped region of a second conductivity type in the well;

forming a second doped region of the first conductivity type in the well and contiguous with the first doped region;

forming an insulative layer on the surface of the substrate in overlying relationship to the well and defining first, second and third contact openings through the insulative layer in spaced apart relationship and exposing the surface of the substrate in the well, the first and second contact openings exposing portions of the first dosed region and the third opening exposing a portion of the second doped region;

field implanting an impurity in the substrate to produce a first region of a second conductivity type in the substrate surrounding the first and second contact openings and beneath the insulative layer;

field implanting an impurity in the substrate to produce a second region of a first conductivity type in the substrate surrounding the third contact opening and beneath the insulative layer;

forming an intrinsic base of the second conductivity type in the substrate in the first contact opening and in contact with the first region;

forming an extrinsic base of the second conductivity type in the substrate in the second contact opening and in contact with the first region;

forming a collector of the first conductivity type in the third contact opening and in contact with the second region; and forming an emitter layer doped with the first conductivity type in the first contact opening in overlying contact with the intrinsic base.

2. A method of fabricating the non-epi bipolar transistor as claimed in claim 1 wherein the step of forming an intrinsic base includes implanting an impurity in the substrate in the first contact opening to form a region in the first contact opening of the second conductivity type.

3. A method of fabricating the non-epi bipolar transistor as claimed in claim 2 wherein the step of forming an extrinsic base includes implanting an impurity in the substrate in the second contact opening to form a region in the second contact opening of the second conductivity type.

4. A method of fabricating the non-epi bipolar transistor as claimed in claim 1 wherein the step of forming a collector includes implanting an impurity in the substrate in the third contact opening to form a region in the third contact opening of the first conductivity type.

5. A method of fabricating the non-epi bipolar transistor as claimed in claim 1 wherein the step of forming an emitter layer doped with the first conductivity type includes the step of growing a layer of polysilicon on the substrate.

6. A method of fabricating the non-epi bipolar transistor as claimed in claim 5 wherein the step of forming an emitter layer doped with the first conductivity type further includes the step of implanting an impurity in the polysilicon layer to convert the polysilicon layer to the first conductivity type.

7. A method of fabricating the non-epi bipolar transistor as claimed in claim 1 wherein forming the insulative layer occurs after forming the first and second doped regions.

8. A method of fabricating the non-epi bipolar transistor as claimed in claim 1 including in addition implanting an impurity in the substrate to create a third region of the second conductivity type in the substrate underlying and in contact with the first region of the second conductivity type and the extrinsic base.

9. A method of fabricating the non-epi bipolar transistor as claimed in claim 1 including in addition implanting an impurity in the substrate to create a third region of the first conductivity type in the substrate underlying and in contact with the second region of the first conductivity type and the collector.

10. A method of fabricating the non-epi bipolar transistor as claimed in claim 9 including in addition implanting an impurity in the substrate to create a fourth region of the first conductivity type below the second region of the first conductivity type and the collector, at least partially in the well and extending into the substrate below the well.

11. A method of making an electronic component comprising:

providing a substrate having a surface and a well of a first conductivity type adjacent to the surface;

forming a first region of a second conductivity type in the well;

forming a second region of the first conductivity type in the well and adjacent to the first region;

forming an insulative layer overlying the surface of the substrate wherein the insulative layer has first and second openings exposing the first region and wherein the insulative layer has a third opening exposing the second region, wherein forming the insulative layer occurs after forming the first region and occurs after forming the second region;

forming an intrinsic base of the second conductivity type through the first opening of the insulative layer and in the substrate;

forming an extrinsic base of the second conductivity type through the second opening of the insulative layer and in the substrate;

forming a collector of the first conductivity type through the third opening of the insulative layer and in the substrate; and forming an emitter layer of the first conductivity type in the first opening of the insulative layer and overlying the intrinsic base.

12. The method of claim 11 wherein the step of forming the emitter layer includes disposing the emitter layer between the extrinsic base and the collector and overlying the surface of the substrate.

13. The method of claim 11 wherein the step of forming the second region includes providing the second region in physical contact with the first region.

14. The method of claim 13 wherein the step of forming the insulative layer includes providing the insulative layer overlying portions of the first and second regions wherein the portions of the first and second regions physically contact each other.

15. The method of claim 11 wherein the step of forming the emitter layer includes providing the emitter layer in physical contact with the intrinsic base.

16. The method of claim 11 further comprising forming a third region of the first conductivity type in the well wherein the third region underlies and physically contacts the second region.

17. The method of claim 16 wherein the step of forming the third region comprises providing the third region underneath the third opening of the insulative layer.

18. The method of claim 16 further comprising forming a fourth region of the first conductivity type in the well wherein the fourth region underlies and physically contacts the third region and extends from the well into the substrate below the well.

19. The method of claim 11 further comprising forming a third region of the second conductivity type in the well wherein the third region underlies and physically contacts the first region.

20. The method of claim 19 wherein the step of forming the third region comprises providing the third region underneath the second opening of the insulative layer.

* * * * *